United States Patent
Mishra et al.

(10) Patent No.: US 10,283,329 B2
(45) Date of Patent: May 7, 2019

(54) ICP SOURCE FOR M AND W-SHAPE DISCHARGE PROFILE CONTROL

(71) Applicant: Applied Materials, Inc., Santa Clara, CA (US)

(72) Inventors: Anurag Kumar Mishra, Fremont, CA (US); James Rogers, Los Gatos, CA (US); John Poulose, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/646,072

(22) Filed: Jul. 10, 2017

(65) Prior Publication Data

US 2019/0013186 A1 Jan. 10, 2019

(51) Int. Cl.
*H01J 37/32* (2006.01)
*H01L 21/67* (2006.01)
*H01L 21/3065* (2006.01)

(52) U.S. Cl.
CPC ..... *H01J 37/32935* (2013.01); *H01J 37/3211* (2013.01); *H01J 37/32183* (2013.01); *H01J 37/32568* (2013.01); *H01J 37/32972* (2013.01); *H01J 2237/33* (2013.01); *H01L 21/3065* (2013.01); *H01L 21/67069* (2013.01)

(58) Field of Classification Search
None
See application file for complete search history.

(56) References Cited

U.S. PATENT DOCUMENTS

| | | | | |
|---|---|---|---|---|
| 5,888,413 A | * | 3/1999 | Okumura | C23C 16/507 118/723 I |
| 6,507,155 B1 | * | 1/2003 | Barnes | H01J 37/321 118/723 R |
| 6,893,533 B2 | * | 5/2005 | Holland | H01J 37/321 118/723 AN |
| 7,520,999 B2 | * | 4/2009 | Chandrachood | H01J 37/321 216/58 |
| 8,062,472 B2 | * | 11/2011 | Liu | H01J 37/321 118/723 AN |
| 8,222,822 B2 | * | 7/2012 | Gilbert | H05H 1/46 118/723 I |
| 8,299,391 B2 | * | 10/2012 | Todorow | H01J 37/32091 118/723 I |
| 9,070,633 B2 | * | 6/2015 | Nangoy | H01J 37/321 |
| 9,305,810 B2 | * | 4/2016 | Singh | H01L 21/67017 |
| 9,839,109 B1 | * | 12/2017 | Leray | H05H 1/46 |
| 9,896,769 B2 | * | 2/2018 | Nguyen | C23F 1/08 |
| 2008/0264904 A1 | * | 10/2008 | Yuen | H01J 37/321 216/67 |

(Continued)

*Primary Examiner* — Dion Ferguson
*Assistant Examiner* — Srinivas Sathiraju
(74) *Attorney, Agent, or Firm* — Patterson + Sheridan LLP (57) ABSTRACT

Apparatuses and methods are provided that, in some embodiments use an adjustable middle coil to tune plasma density in a plasma processing system. For example, in one embodiment, a plasma processing apparatus includes an impedance match circuit coupled to an Rf power source. The impedance match circuit measures voltage and current at an inner and an outer coil. The match circuit calculates plasma density from the measured voltage and/or current. An adjustable middle coil located between the inner and outer coils is adjusted and/or replaced to tune the plasma density radial profile.

18 Claims, 5 Drawing Sheets

(56) References Cited

U.S. PATENT DOCUMENTS

| | | | | |
|---|---|---|---|---|
| 2010/0025384 A1* | 2/2010 | Todorow | ........... | H01J 37/32091 |
| | | | | 219/121.54 |
| 2012/0322270 A1* | 12/2012 | Long | ..................... | H01J 37/321 |
| | | | | 438/710 |
| 2013/0105086 A1* | 5/2013 | Banna | ....................... | H05H 1/46 |
| | | | | 156/345.38 |

* cited by examiner

ICP SOURCE FOR M AND W-SHAPE DISCHARGE PROFILE CONTROL

BACKGROUND

Field of the Disclosure

Embodiments of the present disclosure generally relate to inductively coupled plasma systems and more specifically to adjusting plasma density distribution over the wafer area in a substrate processing system.

Description of the Related Art

Plasma reactors are typically employed in performing various processes on semiconductor substrates, including etching processes and chemical vapor deposition processes. An inductively coupled RF plasma reactor typically has inductive coil antenna wound around the reactor chamber and connected to a plasma source RF power supply. An inductively coupled RF plasma reactor can achieve a very high plasma ion density for high production throughput, while avoiding a concomitant increase in ion bombardment damage of the substrate.

Inductively coupled plasma reactors typically have a plasma ion density distribution that can vary greatly depending upon various processing parameters, including the particular process gas or gas mixture introduced into the reactor chamber. For example, the plasma ion density may be high at the substrate center and low at the substrate periphery for one process gas, while for another process gas it may be the opposite pattern (i.e., low at the wafer center and high at the substrate periphery). Center to edge profile tune-ability is desired to compensate for in-coming wafer non-uniformities (from previous process steps). As a result, the RF coil designs are customized for each different process or process gas to provide commercially acceptable uniformity across a substrate surface in the reactor. A plurality of RF coils, typically two coils, are utilized to improve plasma uniformity in the processing chamber, and each RF coil is connected to a separate individual RF power source through separate RF match networks dedicated to control the amount of RF power delivered to the RF coil. There are instances when the coils cause plasma profile densities that result in non-uniformities on the substrate.

SUMMARY

Embodiments of the present disclosure generally relate to inductively coupled plasma systems and more specifically to adjusting plasma density in a wafer processing system. In one embodiment, a plasma processing apparatus is provided that includes a chamber lid and a chamber body enclosing a processing region. An inner coil and an outer coil are disposed about the processing region. An adjustable middle coil is between the inner coil and the outer coil. An impedance match circuit is coupled to the inner coil and the outer coil. An RF power source is coupled to the match circuit.

In another embodiment, a method measures current and voltage of an inner coil using an impedance match circuit in a plasma processing system. Current and voltage for an inner coil and an outer coil are measured using the impedance match circuit. The impedance match circuit calculates plasma density from the measured current and measured voltage of the inner coil and the outer coil. The plasma density by changing the resonant frequency of an adjustable middle coil. Plasma density can be measured in real-time.

In yet another embodiment, a method that uses an impedance match circuit to measure inputs and outputs of an inner coil and an outer coil in a plasma processing system. The impedance match circuit calculates plasma density from at least one of the measured inputs and the measured outputs. The plasma profile density is adjusted using an adjustable middle coil, in response to the calculated plasma density.

Other embodiments of this disclosure are provided that include other methods, apparatuses and systems having features similar to the apparatus and method described herein.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, wherever possible, to designate identical elements that are common to the figures.

DETAILED DESCRIPTION

In the following description, numerous specific details are set forth to provide a more thorough understanding of the disclosure. As will be apparent to those skilled in the art, however, various changes using different configurations may be made without departing from the scope of the disclosure. In other instances, well-known features have not been described in order to avoid obscuring the disclosure. Thus, the disclosure is not considered limited to the particular illustrative embodiments shown in the specification and all such alternate embodiments are intended to be included in the scope of the appended claims.

Figure 1:
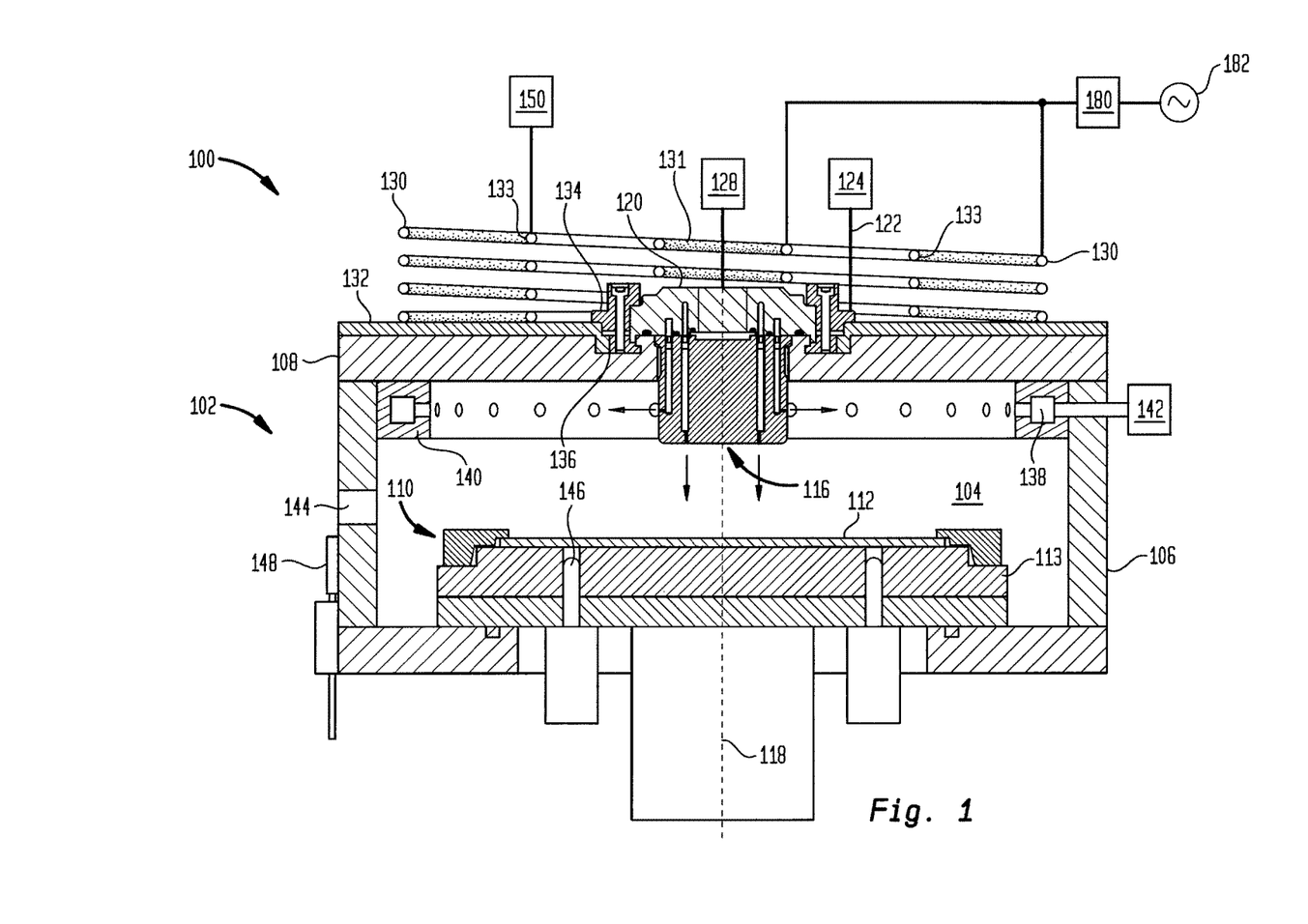
FIG. 1 depicts is a cross sectional view of a system that includes a middle coil in accordance with embodiments disclosed herein.

In short, embodiments disclosed herein include systems; apparatuses; and methods for adjusting the plasma field in a substrate plasma processing system. In various embodiments, a match circuit (further described below) that is used to match impedance loads can also be used to take measurements for calculation of plasma density. In various embodiments, a relational module can be used to relate/ determine plasma profile density from measured output(s). For illustrative purposes only, current and/or voltage measurements from the inner coil 131 and outer coil 130 are used. In response thereto, a "middle coil" is used to adjust/tune a plasma field to generate a desired plasma profile density. In one embodiment, the height of the middle coil 133 with respect to a chamber lid 108 can be adjusted; and/or the diameter of the middle coil 133 with respect to the center line 118 can be adjusted; and/or the resonance of the middle coil can be adjusted. In another embodiment, a capacitor is connected to the middle coil to tune the resonance of the middle coil. For example, one capacitor connected to the middle coil may be replaced with another capacitor having a difference capacitance to tune the resonance of the middle coil. In another example, the capacitor connected to the middle coil may be an adjustable capacitor which enables the capacitance to be changed so that the resonance of the middle coil may be tuned as desired.

FIG. 1 depicts is a cross sectional view of a system 100 that includes an adjustable middle coil 133 in accordance with embodiments disclosed herein. There are multiple embodiments of adjustable middle coils described herein (e.g., middle coil 113 and middle coil 152). In some instances, the different embodiments are referred to as a "middle coil."

The substrate processing system 100 includes a chamber body 102 having a processing volume 104 defined therein. The chamber body 102 may include sidewalls 106 and the chamber lid 108. A substrate support assembly 110 may be disposed in the processing volume 104. The substrate support assembly 110 supports a substrate 112 during processing. A slit valve opening 144 may be formed in the chamber wall 106 to allow a robot (not shown) to move substrates in and out of the processing volume 104. A slit valve door 148 may be used to selectively close the slit valve opening 144. A plurality of lift pins 146 may be selectively extended from the substrate support assembly 110 to facilitate substrate transfer between the robot and the substrate support assembly 110. In one embodiment, the substrate support assembly 110 may include an electrostatic chuck 113 for securing the substrate 112 thereon during processing.

"Adjustable" as used herein is defined as able to be adjusted, changed to different positions and/or sizes, removed, and/or substituted. For example, in various embodiments, the adjustable middle coil 133 can be adjusted as follows: the height of the middle coil 133, with respect to the chamber lid 108, can be changed; the diameter of the middle coil 133 can be changed; an optional capacitor may be removed or added; the optional capacitor may be fixed, replaced with another fixed capacitor having a different value, or be a variable capacitor; and/or the middle coil having a set of physical properties may be substituted with another middle coil having different set of physical properties (e.g., a middle coil having one wind may be substituted with a middle coil having multiple winds).

The chamber lid 108 has an opening 116 to allow entrance of one or more processing gases. The opening 116 may be a central opening located near a center line 118 of the substrate processing system 100 and correspond to a center of the substrate 112 being processed.

A gas delivery assembly 120 is disposed over the chamber lid 108 through the opening 116. The gas delivery assembly 120 may be connected to a gas source 124 through one or more gas input lines 122 to supply one or more processing gases to the processing volume 104. In one embodiment, the one or more processing gases may exit the processing volume 104 via a pumping channel 138 formed in a liner 140 disposed inside the processing volume 104. The pumping channel 138 may be in fluid communication with a vacuum pump 142. Alternatively, the vacuum pump 142 may be connected to the processing volume 104 through another exhaust port formed through the chamber body 102.

A system controller 128 is provided that facilitates control of the components of the process system 100. The system controller 128 includes a central processing unit ("CPU") (not shown), a memory (not shown), and support circuits (not shown) for the CPU. The memory of the CPU may be one or more of readily available memory such as random access memory ("RAM"), read only memory ("ROM"), floppy disk, hard disk, or any other form of digital storage, local or remote. The support circuits include, but are not limited to, cache; power supplies; clock circuits; input/output circuitry and subsystems; and the like. Methods described herein are generally stored in the memory or other computer-readable medium accessible to the CPU as a software routine(s). Alternatively, such software routine(s) may also be stored and/or executed by a second CPU (not shown) that is remotely located from the hardware being controlled by the CPU.

The substrate processing system 100 includes the inner coil 131, the adjustable middle coil 133 and the outer coil 130 disposed over the chamber lid 108. The inner coil 131 and the outer coil 130 are coupled to an RF power source 182 through a matching circuit 180. Power applied to the coils 130, 131 from the RF power source 182 is inductively coupled through the chamber lid 108 to generate plasma from the process gases provided from the gas source 124 within the processing volume 104. There are instances when there is a high plasma density between the inner coil 131 and the outer coil 130. In one embodiment, an electrical property of the middle coil 133 can be adjusted to alter resonant frequency of the coil 134, thus controlling the plasma density profile of the plasma within the processing volume 104 created by the inner coil 131 and outer coil 130. In another embodiment, the middle coil 133 can be replaced with a different middle coil 133 that has a different electrical property such that the resonant frequency is different than the replaced adjustable middle coil 133. In one embodiment, the adjustable middle coil 133 includes one turn (i.e., one loop) of highly conductive material. In another embodiment, the adjustable middle coil 133 includes multiple winds (i.e., multiple loops) of highly conductive material.

A heater assembly 132 may be disposed over the chamber lid 108. The heater assembly 132 may be secured to the chamber lid 108 by clamping members 134, 136. The gas delivery assembly 120 is configured to supply one or more processing gases to the processing volume 104 in a uniform manner.

Figure 2:
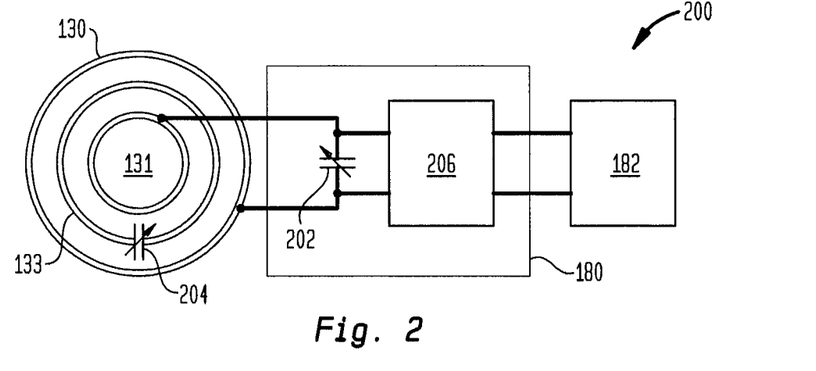
FIG. 2 depicts an embodiment of a coil adjustment system in accordance with material disclosed herein.

FIG. 2 depicts an embodiment of a coil adjustment system 200 in accordance with material disclosed herein. The coil adjustment system 200 includes the adjustable middle coil 133 disposed between the inner coil 131 and the outer coil 130. A match circuit 180 includes an impedance match box 206 and a variable capacitor 202. The variable capacitor 202 couples the inner coil 131 and the outer coil 130 to the match circuit 180. The match circuit 180 is also coupled to an RF power source 182. Variable capacitor 202 is used to control current between the inner coil 131 and the outer coil 130.

Current flows from the RF power source 182 through the coils, plasma, substrate, substrate support and chamber wall and back to the ground of the RF power source 182. The RF power source 182 can provide current at different frequencies to create different plasma densities and voltages.

The match circuit 180 provides impedance matching. Impedance matching increases the likelihood that there is a maximum power transfer between the RF power source 182 and load (i.e., the plasma). Impedance matching also helps to protect the circuit from damage due to "reflected power."

For illustrative purposes only, attributes such as current and/or voltage sensed at the match circuit 180 may be used for calculating the plasma density profile of the plasma formed within the chamber body 102. In one embodiment, the controller 128 is coupled to the match circuit 180 and calculates the plasma profile density using one or more input and/or output variables obtained from the match circuit 180.

In embodiments wherein the middle coil 133 includes a capacitor 204, changing the capacitance of the capacitor 204 changes the resonance of the middle coil 133. Changing the resonance also alters plasma density. The capacitor 204 may be a variable capacitor, thus enabling the capacitance of the capacitor 204 to be changed, for example, in response to instructions from the controller 128. In another embodiment, the capacitor 204 can be substituted with another capacitor having a different capacitance, thus enabling the capacitance of the capacitor 204 coupled to the middle coil 133 to be changed. The capacitor 204 is used to vary resonance frequency of middle coil 133, which in turn varies the RF power coupled to middle coil 133. The RF power deposition profile over the substrate area is varied to adjust M/W shape plasma non-uniformity.

In one embodiment, of the coil adjustment system 200 the actuator 150 adjusts the height of the middle coil 133 relative to the chamber lid 108. In yet another embodiment, an actuator 154 (shown in FIG. 3B) adjusts the diameter of the middle coil 133 relative to the center line 118, the inner coil 131 and the outer coil 130. In another embodiment, the coil adjustment system 200 allows replacement/substitution of the middle coil 133 with a different middle coil and/or capacitor 204 to tune plasma density.

Figure 3A:
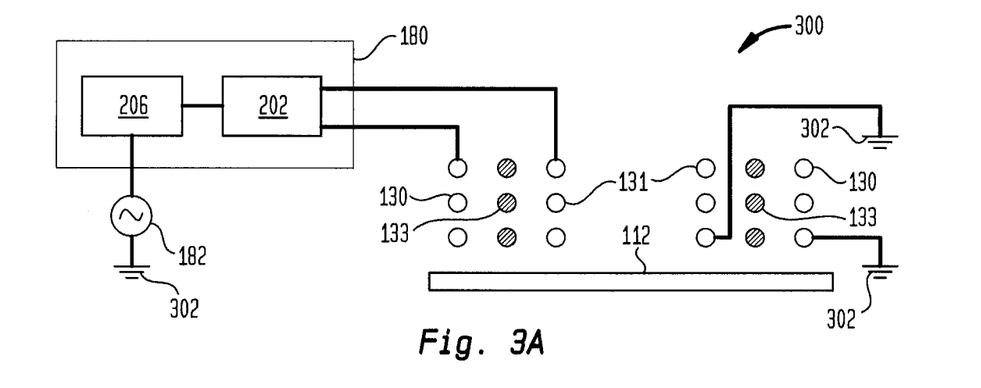
FIG. 3A depicts a cross sectional view of chamber design that utilizes a middle coil in accordance with embodiments described herein.

FIG. 3A depicts a cross sectional view of chamber design 300 that utilizes an adjustable middle coil in accordance with embodiments described herein. Chamber design 300 depicts the adjustable middle coil 133 including multiple turns (i.e., complete loops) that may be utilized with the substrate processing system 100 illustrated in FIG. 1. FIG. 3A also depicts the system controller 128, the inner coil 131 and the outer coil 130. The power leads from the match circuit 180 are coupled to first ends of the coils 130, 131, while the other ends of the coils 130, 131 are connected to ground 302. When the characteristics of the middle coil are changed, the plasma profile characteristics can be changed. As indicated above, the height; diameter and/or physical characteristics (e.g., replacing a middle coil have a number of turns with a different middle coil having a different number of turns), of the middle coil can be changed to change the plasma profile characteristics. The characteristics of the middle coil can also be changed by adding/replacing/removing an optional capacitor that can fixed or variable capacitor.

Figure 3B:
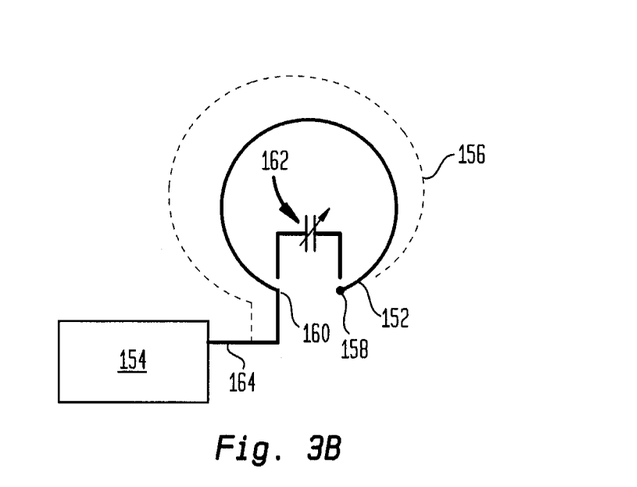
FIG. 3B depicts an embodiment of an adjustable middle coil in accordance with embodiments described herein.

FIG. 3B depicts an embodiment of an adjustable middle coil 152 in accordance with embodiments described herein. The adjustable middle coil 152 is "split ring" having at least one end coupled to an actuator 154. The actuator 154 increases the diameter of the adjustable middle coil 152 by pulling on a rod 164 connect to end 160 of the middle coil 152 which forces ends 158 and 160 of the middle coil 152 apart. Likewise, the actuator 154 can decrease the diameter of the adjustable middle coil 152 extending the rod 164 to allow the ends 158 and 160 to move closer together. For example, FIG. 3B shows a position 156 where the actuator 154 and rod 164 have pulled ends 150 and 160 apart to increase the diameter of the adjustable middle coil 152. FIG. 3B also depicts an optional capacitor 162 that may be utilized to connect the ends 150, 160 of the coil 152 or be otherwise coupled to the coil 152 to adjust the resonance of the coil 152. The capacitor 162 may be a fixed or variable capacitor and be utilized to tune the resonance of the coil 152 as discussed above. "Optional" as used herein is defined as available to be chosen but not obligatory. In one embodiment, optional capacitor 162 has a fixed value. In another embodiment, optional capacitor 162 is a variable capacitor.

Figure 4:
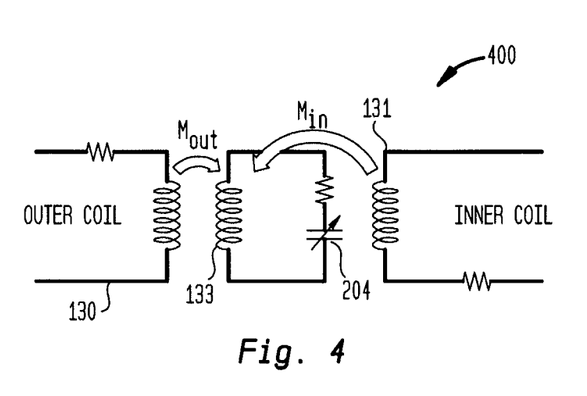
FIG. 4 depicts an example of a circuit diagram that can be used in accordance with embodiments disclosed herein.

FIG. 4 depicts an example of a circuit diagram 400 that can be used in accordance with embodiments disclosed herein. Specifically, the circuit diagram 400 includes adjustable middle coil 133 between inner coil 131 and outer coil 130. The adjustable middle coil 133 includes a capacitor 204 coupled thereto. Although the capacitor 204 is depicted in FIG. 4 as a variable capacitor, in one embodiment the capacitor 204 is fixed. Various equations can be used to calculate the effects of the middle coil upon the inner coil 131 and the outer coil 130. For example, Eq. (1) provides:

$$Mo = K1(Lo*Lm)^{1/2} \qquad \text{Eq. (1)}$$

where Mo is the mutual inductance between the outer coil 130 and the middle coil 133, K1 is a coupling coefficient that is the ratio of the middle coil 133 to the outer coil 130, Lo represents the inductance of the outer coil 130 and Lm represents the inductance of the adjustable middle coil 133.

$$Mi = K2(Li*Lm)^{1/2} \qquad \text{Eq. (2)}$$

where Mi is the mutual inductance between the inner coil 131 and the middle coil 133, K2 is a coupling coefficient that is the ratio of the inner coil 131 to the middle coil 133, Li represents the inductance of the inner coil 131 and Lm represents the inductance of the adjustable middle coil 133.

Figure 5:
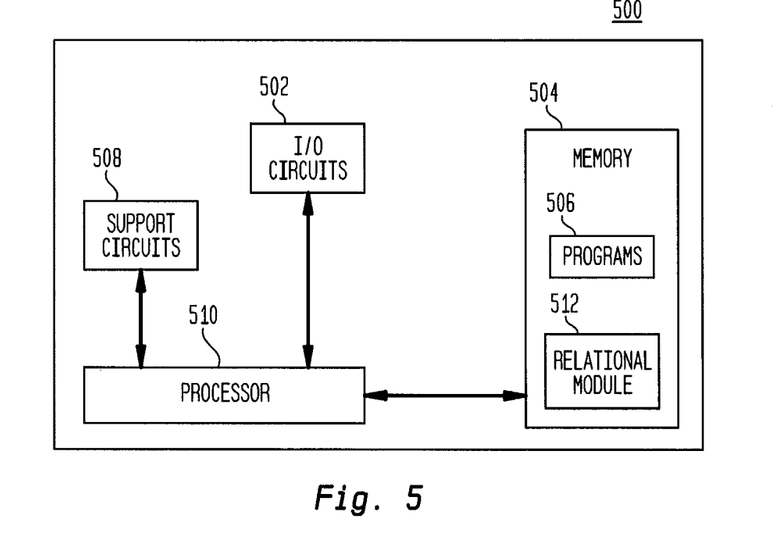
FIG. 5 depicts an embodiment of a high-level block diagram of a matching system for adjusting plasma density in accordance with embodiments disclosed herein.

FIG. 5 depicts an embodiment of a high-level block diagram of a matching system 500 for adjusting plasma density in accordance with embodiments disclosed herein. For example, the matching system 500 is suitable for use in performing the methods of FIG. 6 and FIG. 7. The matching system 500 includes a processor 510 as well as a memory 504 for storing control programs and the like.

In various embodiments, memory 504 also includes programs (e.g., depicted as a "relational module" 512 that use an algorithm(s) that calculates plasma density from measured current and/or voltage of the inner coil 131 and the outer coil 130. In other embodiments, the memory 504 includes programs (not shown) for matching the impedance load.

The processor 510 cooperates with conventional support circuitry 508 such as power supplies, clock circuits, cache memory and the like as well as circuits that assist in executing the software routines 506 stored in the memory 504. As such, it is contemplated that some of the process steps discussed herein as software processes can be loaded from a storage device (e.g., an optical drive, floppy drive, disk drive, etc.) and implemented within the memory 504 and operated by the processor 510. Thus, various steps and methods of the present disclosure can be stored on a computer readable medium. The matching system 500 also contains input-output circuitry 502 that forms an interface between the various functional elements communicating with the matching system 500.

Although FIG. 5 depicts a matching system 500 that is programmed to perform various control functions in accordance with the present disclosure, the term computer is not limited to just those integrated circuits referred to in the art as computers, but broadly refers to computers, processors, microcontrollers, microcomputers, programmable logic controllers, application specific integrated circuits, and other programmable circuits, and these terms are used interchangeably herein. In addition, although one general-purpose computer 1000 is depicted, that depiction is for brevity on. It is appreciated that each of the methods described herein can be utilized in separate computers.

Figure 6:
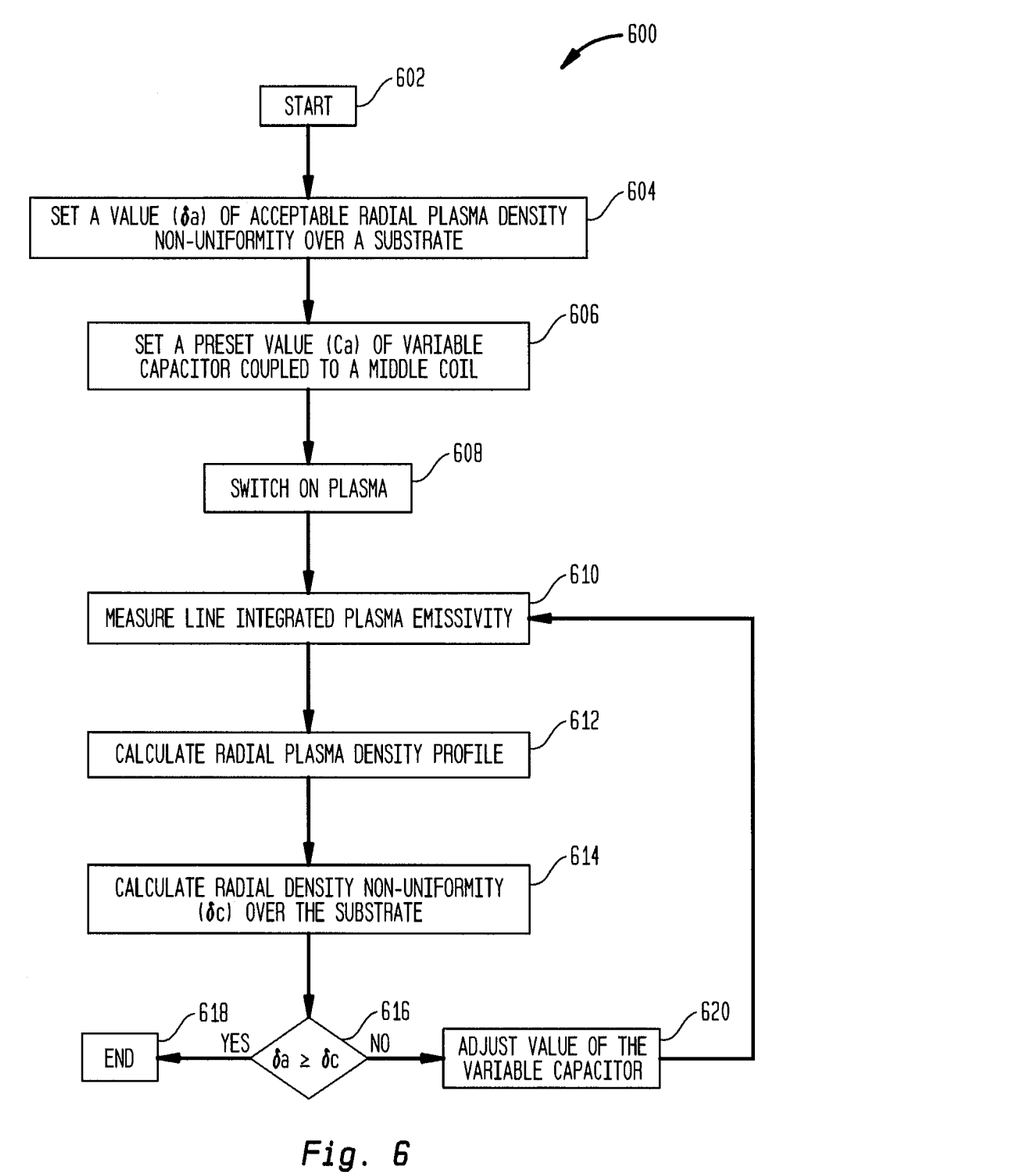
FIG. 6 depicts an example of a method of adjusting plasma density in accordance with embodiments disclosed herein.

FIG. 6 depicts an example of a method 600 of adjusting plasma density in accordance with embodiments disclosed herein. The method 600 begins at block 602. At block 604, an acceptable value for radial plasma density non-uniformity, "delta a" ($\delta a$), over the substrate 112 is selected.

At block 606, variable capacitor 204, connected to middle coil 133, is adjusted to have a capacitance value (Ca). Ca can be set according to data obtained during experimentation.

At block 608 the plasma is switched "ON." At block 610, the line plasma emissivity is measured from the center line 118 to various distances from the center line 118 (e.g., 10 mm, 20 mm, and/or 30 mm from the center line 118). The line plasma emissivity can be measured used various techniques. For example, optical emission spectroscopy (OES) using an ion energy distribution sensor (not shown) can be used to measure line plasma emissivity.

At block 612, the radial density profile is calculated using the measurements acquired at block 610. For example, in one embodiment, the integrated plasma emissivity is measured and used in an Able Inversion calculation to determine the radial density profile.

At block 614, the radial plasma density non-uniformity, "delta c" ($\delta c$), over the substrate 112 is calculated using the results calculated in block 612. There are various ways in which $\delta c$ is calculated. Eq. (3) provides an example calculation of $\delta c$.

$$\delta c = ((N_{max} - N_{min})/N_{max}) \times 100 \qquad \text{Eq. (3)}$$

where $N_{max}$ is a maximum plasma density over the substrate area and $N_{min}$ is a minimum plasma density over the substrate area.

At block 616, $\delta a$ is compared to $\delta c$. It is desired to obtain a plasma density non-uniformity that is greater than or equal to $\delta a$. If $\delta a$ is greater than or equal $\delta c$ then the method 600 proceeds towards and ends at block 618. If however, $\delta c$ is not greater than or equal to $\delta c$ the method 600 proceeds towards block 620. At block 620, the capacitance of variable capacitor 204 is adjusted. After adjusting the variable capacitor 204 at block 620, the method 600 proceeds towards block 610. Blocks 620, 610, 612, 614, and 616 act as an iterative loop to adjust the capacitor until $\delta a$ is greater than or equal to $\delta c$.

Figure 7:
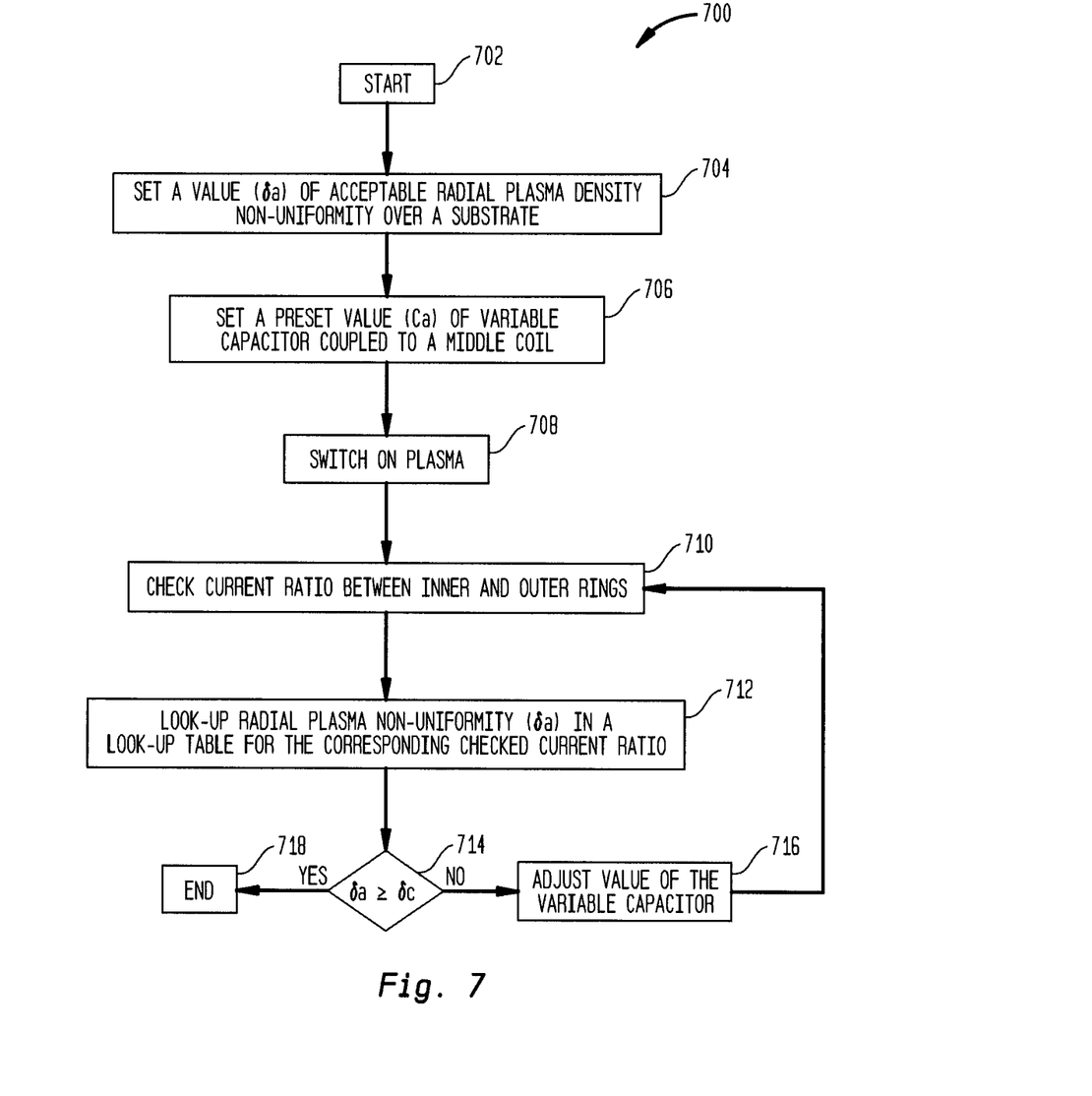
FIG. 7 depicts an example a method of adjusting plasma density in accordance with embodiment disclosed herein.

FIG. 7 depicts an example a method 700 of adjusting plasma density in accordance with embodiment disclosed herein. The method 700 begins at block 702. At block 704, an acceptable value for radial plasma density non-uniformity, "delta a" ($\delta a$), over the substrate 112 is selected.

At block 706, variable capacitor 204, connected to middle coil 133, is adjusted to have a capacitance value (Ca). Ca can be set according to data obtained during experimentation.

At block 708 the plasma is switched "ON." At block 710, a current ratio is checked between the inner coil 131 and the outer coil 130 of the inductively coupled plasma (ICP) source at a source match output (not shown). At block 712, a look-up table (not shown) stored in memory is accessed. The look-up table contains, but is not limited to, current ratios and plasma non-uniformities "delta c" ($\delta c$) values associated with the current ratios. A current ratio in the look-up table is found that is similar to the current ratio found at block 710. When the correct current ratio is found, the $\delta c$ associated with that current ratio is used at block 714.

At block 714, $\delta a$ is compared to $\delta c$. If $\delta a$ is greater than or equal $\delta c$ then the method 700 proceeds towards and ends at block 718. If however, $\delta c$ is not greater than or equal to $\delta c$ the method 700 proceeds towards block 716. At block 716, the capacitance of variable capacitor 204 is adjusted. After adjusting the variable capacitor 204 at block 716, the method 700 proceeds towards block 710. Blocks 716, 710, 712, and 714 act as an iterative loop to adjust the capacitor until $\delta a$ is greater than or equal to $\delta c$.

As used herein, the terms "having," "containing," "including," "comprising" and the like are open ended terms that indicate the presence of stated elements or features, but do not preclude additional elements or features. The articles "a," "an," and "the" are intended to include the plural as well as the singular, unless the context clearly indicates otherwise. "Similar" as used herein is defined as the same as or almost the same as something else.

While the foregoing is directed to embodiments of the present disclosure, other and further embodiments of the disclosure may be devised without departing from the basic scope thereof, and the scope thereof is determined by the claims that follow.

We claim:

1. A plasma processing apparatus, comprising:
   a chamber lid and a chamber body enclosing a processing region;
   an inner coil disposed above the processing region;
   an outer coil disposed about the processing region and the inner coil;
   an adjustable middle coil between the inner coil and the outer coil wherein the adjustable middle coil has a resonance frequency at one set of input parameters and is replaceable with a different middle coil that has a different resonant frequency at the one set of input parameters;
   an impedance match circuit coupled to the inner coil and the outer coil; and
   an Rf generator coupled to the impedance match circuit.

2. The plasma processing apparatus of claim 1 wherein the adjustable middle coil is coupled to a capacitor to adjust resonant frequency of the adjustable middle coil.

3. The plasma processing apparatus of claim 1 wherein the adjustable middle coil is at least one wind of conductive material.

4. The plasma processing apparatus of claim 1 wherein the adjustable middle coil is coupled to an adjustable capacitor to adjust resonant frequency of the adjustable middle coil.

5. The plasma processing apparatus of claim 1 wherein a diameter of the adjustable middle coil is adjustable with respect to a diameter of the inner coil and a diameter of the outer coil.

6. The plasma processing apparatus of claim 1 wherein distance of the adjustable middle coil from the chamber lid is adjustable.

7. A method comprising:
   selecting a radial plasma density non-uniformity value;
   selecting a capacitor value for a variable capacitor coupled to an adjustable middle coil;
   switching a plasma source ON;
   measuring line integrated plasma emissivity; and
   calculating a radial plasma density profile;
   calculating a radial plasma density non-uniformity from the plasma density profile;

comparing the calculated radial plasma density non-uniformity to the selected radial plasma density non-uniformity value, and adjusting the variable capacitor, to increase the calculated radial plasma density non-uniformity, until the selected radial plasma density non-uniformity value is one of greater than the calculated radial plasma density non-uniformity and equal to the calculated radial plasma density non-uniformity.

8. The method of claim 7 wherein the selecting of the radial plasma density non-uniformity value further comprises at least one of:

altering a distance of the adjustable middle coil from a chamber lid;

altering a diameter of the adjustable middle coil to change a radius of power deposition in plasma from the adjustable middle coil; and replacing the adjustable middle coil with a different adjustable middle coil.

9. The method of claim 7 wherein the line integrated plasma emissivity is measured using an ion energy distribution sensor and optical emission spectroscopy.

10. The method of claim 7 wherein the calculated radial plasma density profile is calculated using Abel Inversion.

11. The method of claim 7 wherein the calculated radial plasma density non-uniformity is calculated using a maximum plasma density over a substrate and a minimum plasma density over the substrate.

12. A method comprising:

selecting a radial plasma density non-uniformity value;

selecting a capacitor value for a variable capacitor coupled to an adjustable middle coil;

switching a plasma source ON;

checking a current ratio between an inner coil and an outer coil;

checking a look-up table for a stored current ratio and a stored radical plasma density non-uniformity associated with the stored current ratio that is similar to the checked current ratio;

comparing the stored radical plasma density non-uniformity to the selected radial plasma density non-uniformity value, and adjusting the variable capacitor, to increase the calculated radial plasma density non-uniformity, until the selected radial plasma density non-uniformity value is one of greater than the calculated radial plasma density non-uniformity and equal to the calculated radial plasma density non-uniformity.

13. The method of claim 12 wherein the current ratio is checked at a source match output.

14. The method of claim 13 wherein a power coupling to plasma of the adjustable middle coil is changed by altering a distance of the adjustable middle coil from a chamber lid.

15. The method of claim 13 wherein a diameter of power coupling to the plasma of the adjustable middle coil is changed by altering the diameter of the adjustable middle coil.

16. The method of claim 13 wherein the resonant frequency, of the adjustable middle coil, is changed by adjusting capacitance of a variable capacitor coupled to the adjustable middle coil.

17. The method of claim 12 further comprising replacing the adjustable middle coil with a different adjustable middle coil.

18. The method of claim 12 further comprising replacing the adjustable middle coil with a different adjustable middle coil after at least one of:

adjusting capacitance of a variable capacitor coupled to the adjustable middle coil;

altering a distance of the adjustable middle coil from a chamber lid; and altering the diameter of the adjustable middle coil.

* * * * *